United States Patent [19]
Homma

[11] Patent Number: 5,584,395
[45] Date of Patent: Dec. 17, 1996

[54] HIGH SPEED SORTING APPARATUS FOR SEMICONDUCTOR DEVICE EQUIPPED WITH ROTATABLE SORTING DRUM

[75] Inventor: Yasuaki Homma, Tokyo, Japan

[73] Assignee: NEC Corporation, Tokyo, Japan

[21] Appl. No.: 407,663

[22] Filed: Mar. 21, 1995

[30] Foreign Application Priority Data

Mar. 24, 1994 [JP] Japan .................................. 6-053439

[51] Int. Cl.$^6$ .................................................. B07C 5/344
[52] U.S. Cl. .......................................... 209/571; 209/573
[58] Field of Search ..................................... 209/571, 573, 209/574, 575, 655; 198/441, 445, 368, 359

[56] References Cited

U.S. PATENT DOCUMENTS

3,543,925  12/1970  Loughery, III ...................... 209/655 X
4,128,174  12/1978  Frisbie et al. ............................ 209/573
4,978,913  12/1990  Hamuro et al. ..................... 209/573 X

*Primary Examiner*—David H. Bollinger
*Attorney, Agent, or Firm*—Young & Thompson

[57] ABSTRACT

A sorting apparatus has a rotatable drum member having sorting through-holes selectively open and closed by associated shutter plates, and semiconductor devices examined by a testing system are sequentially stored in the sorting through-holes: when one of the sorting through-holes is aligned with a storage box for the decided grade, the shutter plate is opened, and the semiconductor device is thrown into the storage box.

8 Claims, 7 Drawing Sheets

HIGH SPEED SORTING APPARATUS FOR SEMICONDUCTOR DEVICE EQUIPPED WITH ROTATABLE SORTING DRUM

FIELD OF THE INVENTION

This invention relates to a sorting apparatus for semiconductor devices and, more particularly, to a sorting apparatus for sorting semiconductor devices into a plurality of groups at high speed.

DESCRIPTION OF THE RELATED ART

A plurality of semiconductor integrated circuits are concurrently fabricated on a semiconductor wafer through a process sequence, and are separated into a plurality of semiconductor chips. The semiconductor chips are sealed in respective packages, and a plurality of semiconductor devices are completed. Although the process sequence is standardized and strictly controlled, the semiconductor integrated circuits are not equalized in device characteristics, and a dispersion takes place among the semiconductor devices.

Even though the device characteristics are different among the semiconductor devices of the same lot, most of the semiconductor devices are deliverable as a high grade product or a low grade product depending upon customer's specification. For this reason, the semiconductor devices are subjected to a test, and are classified into different grades on the basis of the result of the test.

Figure 1:
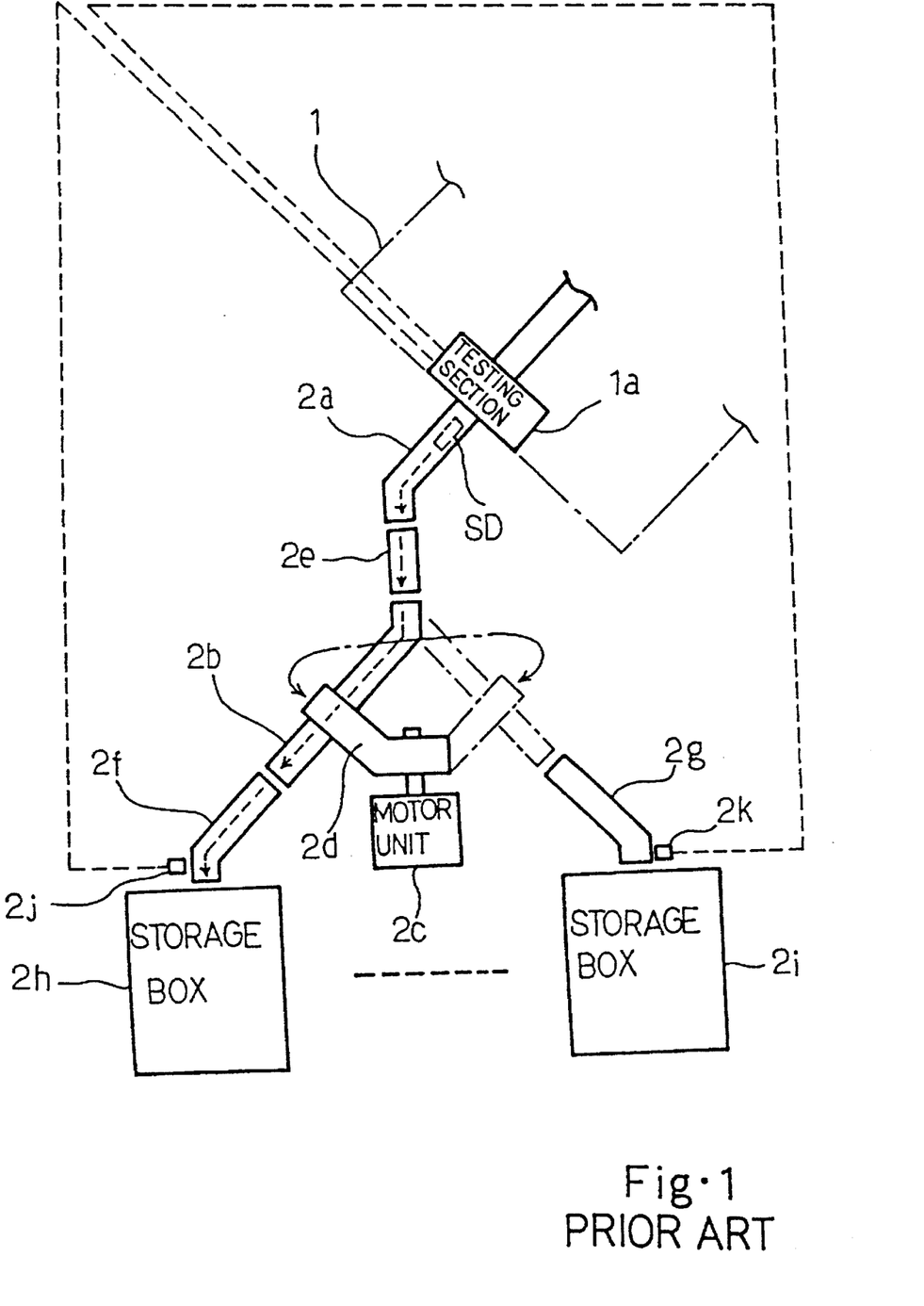
FIG. 1 is a schematic view showing the prior art sorting apparatus.

FIG. 1 illustrates a typical example of the sorting apparatus used for the semiconductor devices. The prior art sorting apparatus is connected to a testing section 1a forming a part of a grading apparatus 1. Semiconductor devices SD are sequentially supplied to the testing section 1a, and the testing section 1 a examines device characteristics of each semiconductor device SD. The testing section 1a determines the grade of each semiconductor device SD, and the semiconductor devices SD thus examined are sequentially supplied to the prior art sorting apparatus.

The prior art sorting apparatus comprises an oblique chute 2a connected to the testing section 1a, a sorter chute 2b connected to an output shaft of a motor unit 2c by means of an arm member 2d, a funnel-shaped chute 2e provided between the oblique chute 2a and the sorter chute 2b, a plurality of classifying chutes 2f and 2g provided around the motor unit 2c, a plurality of storage boxes 2h and 2i respectively associated with the classifying chutes 2f and 2g and a plurality of photo-sensors 2j and 2k, respectively associated with the classifying chutes 2f and 2g for detecting the semiconductor device SD, and the plurality of storage boxes 2h and 2i are corresponding to the grades.

The motor unit 2c changes an angular position of the sorter chute 2b, and the sorter chute 2b connects the funnel-shaped chute 2e to one of the classifying chutes 2f and 2g depending upon the angular position thereof. For example, while the sorter chute 2b is being maintained at the angular position as indicated by the real line in FIG. 1, the shorter chute 2b connects the funnel-shaped chute 2e to the classifying chute 2g, and the semiconductor device SD is conveyed to the storage box 2h. On the other hand, if the sorter chute 2b is changed to the angular position indicated by a dot-and-dash line, the semiconductor device SD is conveyed to the storage box 2i.

In operation, when the test is completed, the testing section 1a determines the grade of the semiconductor device SD, and the motor unit 2c changes the angular position of the sorter chute 2b depending upon the grade of the semiconductor device SD. The testing section 1a delivers the semiconductor device SD to the oblique chute 2a, and the semiconductor device SD slides along the oblique chute 2a, the funnel-shaped chute 2e, the sorter chute 2b and one of the classifying chute 2f/2g. The semiconductor device SD arrives at the storage box 2h or 2i corresponding to the grade decided by the testing section 1a.

When the semiconductor device SD passes an optical path radiated from the photo-sensor 2j or 2k, the photo-sensor 2j or 2k informs the testing section of the detection of the semiconductor device SD, and the testing section starts the examination on a new semiconductor device SD.

The total time period T1 consumed in the testing/sorting operation is expressed by equation 1.

$$T1 = t1 + t2 + t3 + t4 \qquad \text{Equation 1}$$

where t1 is a time period consumed by the testing section 1a, t2 is a time period for changing the angular position of the sorter chute 2b, t3 is a time period for the semiconductor device SD sliding along the oblique chute 2a and the funnel-shaped chute 2e and t4 is a time period for the semiconductor device SD sliding along the sorter chute 2b and the classifying chute 2f or 2g.

The time period t1 is rather short compared to the total time period of t2, t3 and t4, and a problem inherent in the prior art sorting apparatus is the long time period consumed in the sorting operation.

Another problem inherent in the prior art sorting apparatus is a jam of the semiconductor device SD in the long traveling path formed in the oblique, funnel-shaped, sorting and classifying chutes 2a, 2e, 2b and 2f/2g.

The present inventor tried to accelerate the semiconductor device SD by blowing high pressure air into the long traveling path. Although the high pressure air accelerated the semiconductor device SD, the semiconductor device SD was violently thrown out into the storage box 2h/2i, and was broken. Moreover, the high pressure air was not effective against the jam.

The present inventor further tried to quickly change the angular position of the sorter chute 2b by increasing the revolution of the motor shaft. However, the sorter chute 2b vibrated at a new angular position due to the large inertia force, and the sorter chute 2b tended to be mis-aligned with the funnel-shaped chute 2a. As a result, the semiconductor devices SD sometimes dropped out of the connecting portion between the oblique chute 2a and the sorter chute 2b. Thus, the previously described approaches do not satisfy the semiconductor manufacturer.

SUMMARY OF THE INVENTION

It is therefore an important object of the present invention to provide a sorting apparatus which classifies semiconductor devices at high speed without a jam.

To accomplish the object, the present invention proposes to form through-holes in a rotatable drum member. The rotatable drum member is well balanced around the center axis rather than the turnable sort chute of the prior art, and the through-holes quickly sort semiconductor devices through a small angular motion.

In accordance with the present invention, there is provided a sorting apparatus for semiconductor devices, comprising: a rotatable drum member having a plurality of through-holes allowing the semiconductor devices to selectively passing therethrough; a driving means provided for the rotatable drum member, and rotating the rotatable drum member so as to selectively align the through-holes with an outlet port for the semiconductor devices; a plurality of shutter plates respectively associated with the plurality of through holes, and each changeable between a first position and a second position, each shutter plate in the first position allowing one of the semiconductor devices to pass through the associated through-hole, each shutter plate in the second position causing the aforesaid one of the semiconductor devices to remain in the associated through-hole; an actuating means associated with the plurality of shutter plates, and operative to change each of the plurality of shutter plates between the first position and the second position; a plurality of storage boxes associated with the through-holes for storing the semiconductor devices passing through the associated through holes; and a controlling means provided for the driving means and the actuating means, and operative to select one of the through-holes to be aligned with the outlet port and to inform the actuating means of one of the first and second positions for each of said plurality of shutter plates.

BRIEF DESCRIPTION OF THE DRAWINGS

The features and advantages of the sorting apparatus according to the present invention will be more clearly understood from the following description taken in conjunction with the accompanying drawings in which.

DESCRIPTION OF THE PREFERRED EMBODIMENTS

First Embodiment

Figure 2:
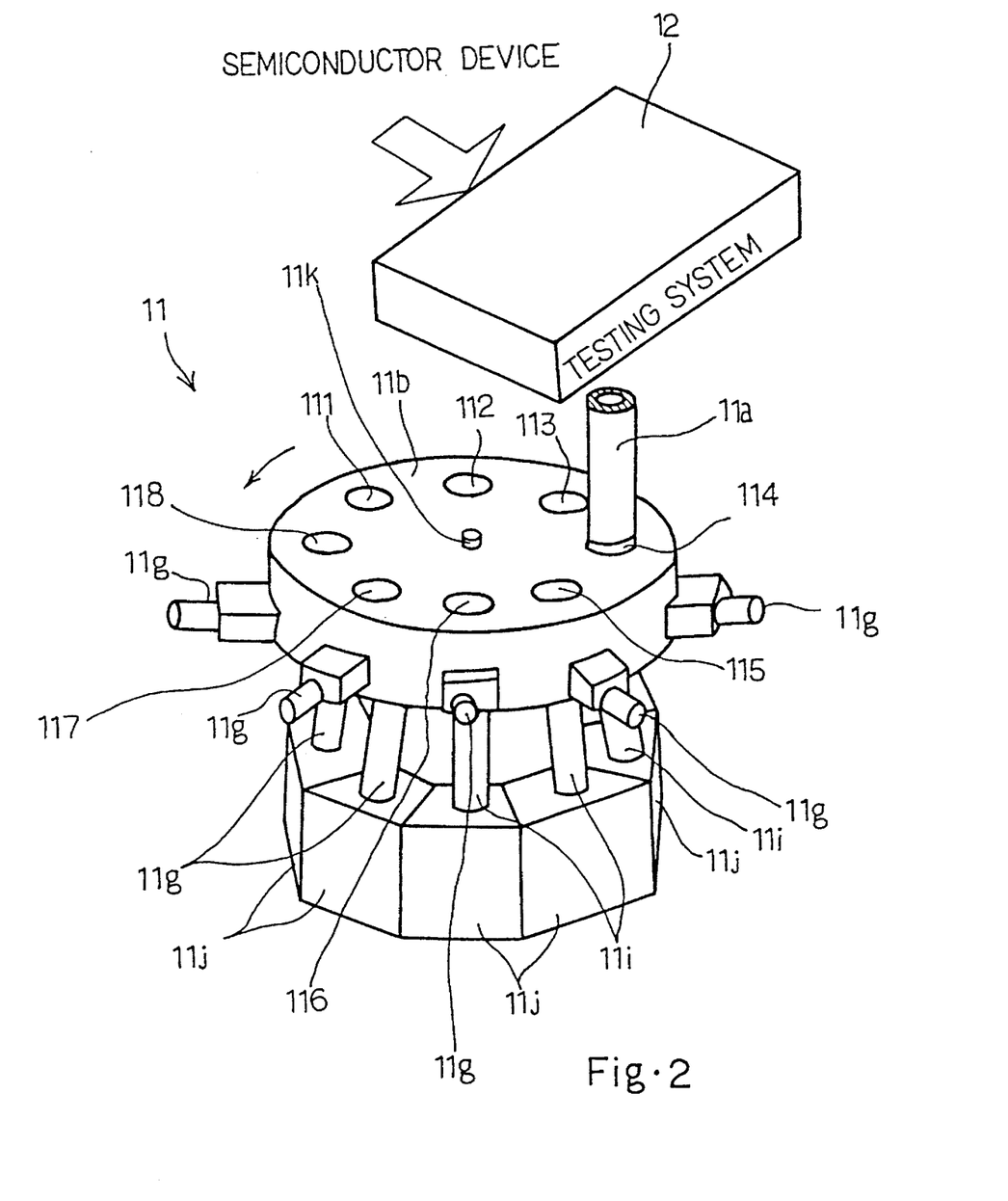
FIG. 2 is a perspective view showing the outer appearance of a sorting apparatus according to the present invention.
Figure 3:
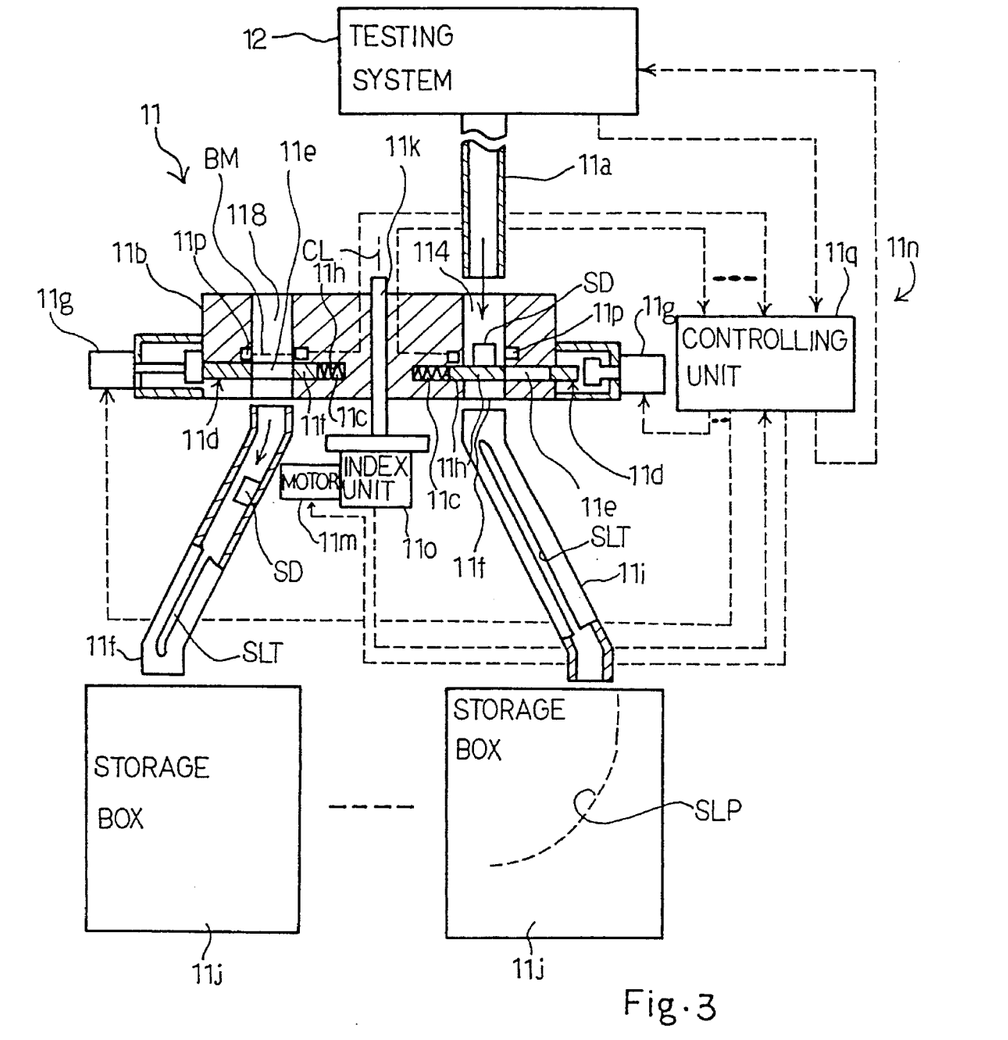
FIG. 3 is a partially cross sectional view showing the structure of the sorting apparatus.

Referring to FIGS. 2 and 3 of the drawings, a sorting apparatus 11 embodying the present invention is connected to a testing system 12. The testing system 12 diagnoses a semiconductor device SD at high speed, and determines the grade of the semiconductor device SD as similar to that connected to the prior art sorting apparatus.

The sorting apparatus 11 comprises a funnel chute 11a connected to an outlet port of the testing system 12 and downwardly projecting therefrom and a drum member 11b rotatably supported by a rigid frame (not shown). The drum member 11b is rigid and well unbalanced around a center axis CL thereof, and a deformation and vibrations do not take place even if the drum member 11b rapidly stops at a selected angular position. The funnel chute 11a makes up the distance between the testing system 12 and the drum member 11b, and is omissible for a drum member 11b provided in close relation to the testing system 12.

A plurality of through-holes 111 to 118 are vertically formed in the outer peripheral portion of the drum member 11b at intervals, and the through-holes 111 to 118 are large enough to receive the semiconductor devices SD. The funnel chute 11a is open at a space over the outer peripheral portion of the drum member 11b, and each of the through-holes 111 to 118 is aligned with the funnel chute 11a depending upon the angular position of the drum member 11b.

Figure 4:
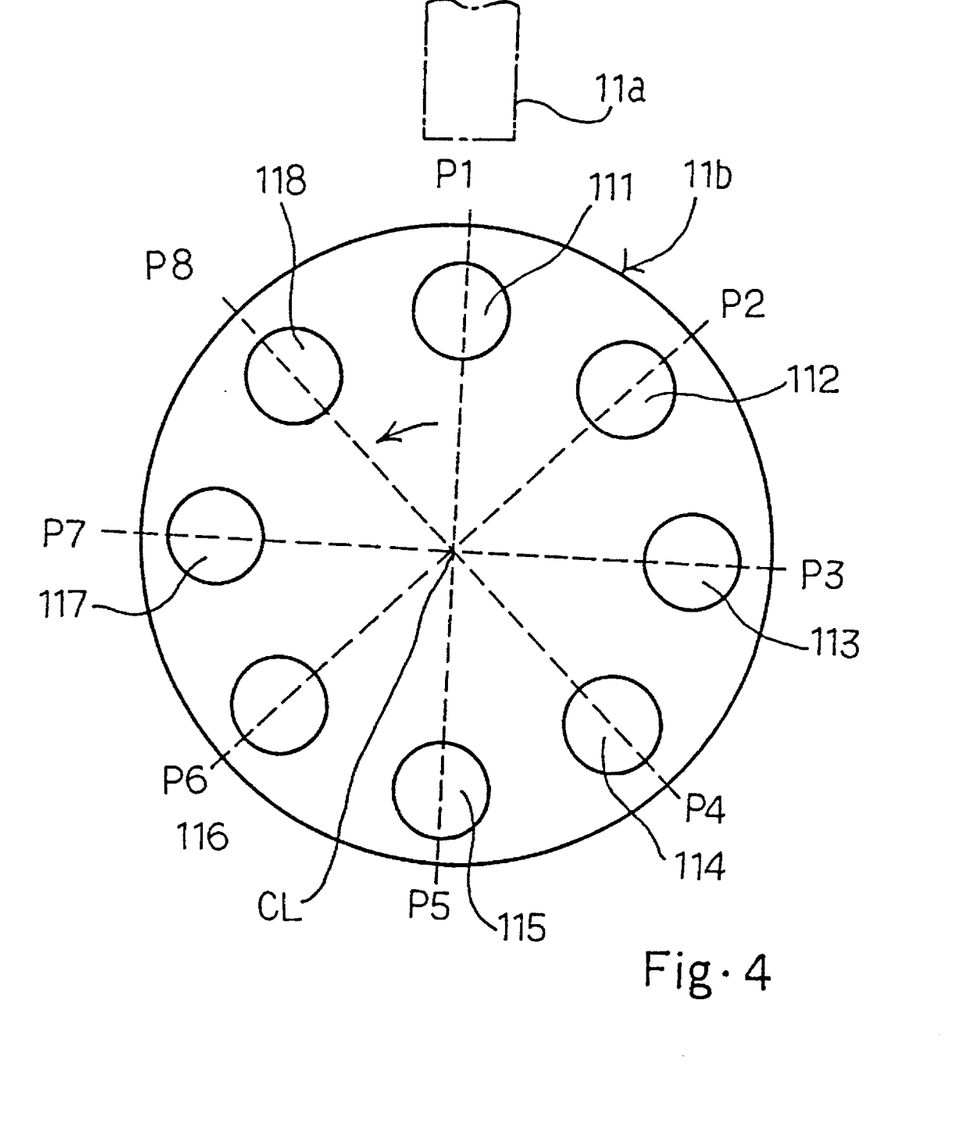
FIG. 4 is a plan view showing the arrangement of through-holes formed in a rotatable drum member incorporated in the sorting apparatus shown in FIGS. 3 and 4.

In this instance, the through-holes 111 to 118 are arranged along an imaginary circle on the upper surface of the drum member 11b at regular intervals as shown in FIG. 4, and adjacent two through-holes are angularly spaced at 45 degrees.

Turing back to FIGS. 2 and 3, a plurality of guide holes 11c are further formed in the drum member 11b, and radially extend in such a manner as to cross the though-holes 111 to 118, respectively. The guide holes have a width slightly larger than the outer diameter of the through-holes 111 to 118.

The sorting apparatus 11 further comprises a plurality of shutter plates 11d slidably inserted into the plurality of guide holes 11c, respectively. Each of the shutter plates 11d has an aperture 11e and a blocking area 11f, and the aperture 11e is aligned with the associated through-hole 111/112/113/114/115/116/117/118. On the other hand, the blocking area 11f shuts the associated through-hole, and maintains the semiconductor device SD thereon.

The sorting apparatus 11 further comprises a plurality of solenoid-operated actuator units 11g radially arranged on the outer periphery of the rotatable drum member 11b and a plurality of return springs 11h respectively inserted into the guide holes 11c. The plurality of solenoid-operated actuator units 11g has respective movable plungers attached to the outer ends of the shutter plates 11d respectively, and the plurality of return spring 11h resiliently urge the inner ends of the shutter plates 11d toward the solenoid-operated actuator units 11g. Therefore, when driving current is not supplied to the solenoid-operated actuator units 11g, the movable plungers are retracted, and the return springs expose the blocking areas 11f to the through-holes 111–118. On the other hand, if the solenoid-operated actuator units 11g are energized, the movable plungers project, and the apertures 11e are aligned with the through-holes 111–118. Thus, the solenoid-operated actuator units 11g and the return springs 11h change positions of the shutter plates 111–118, and the solenoid-operated actuator units 11g and the return springs 11h as a whole constitute an actuating means.

The sorting apparatus 11 further comprises a plurality of classifying chutes 11i angularly spaced from one another so as to be aligned with the through-holes 111–118 and a plurality of storage boxes 11j respectively connected to the classifying chutes 11i. The classifying chutes 11i make up the distance between the rotatable drum member 11b and the storage boxes 11j, and are omissible if the storage boxes 11j are placed immediately under the drum member 11b. Moreover, the classifying chutes 11i are obliquely arranged between the drum member 11b and the storage boxes 11j, and, for this reason, the semiconductor devices SD are decelerated in the classifying chutes 11j due to the friction. This results in that the semiconductor devices SD are prevented from breakage at the bottom surfaces of the storage boxes 11j. The positions of the storage boxes 11j are labeled with P1 to P8 in FIG. 4, and the funnel chute 11a is assumed to be provided over the position P1.

In this instance, the classifying chutes 11i are equal in number to the through-holes 111–118. However, if the grades are less than the number of the through-holes 111–118, the classifying chutes 11i may provide for the selected through-holes, and the storage boxes 11j may be also partially removed.

Moreover, each of the classifying chutes 11i may be integral with the associated storage box 11j.

It is recommendable to form a sloop SLP in the storage box 11j. The slope SLP guides the semiconductor device SD thrown into the storage box 11j, and prevents the semiconductor device SD from breakage at the bottom surface of the storage box 11j.

In this instance, the classifying chutes 11i are formed of non-transparent substance, and monitoring slots SLT are formed along the classifying chutes 11i so as to check the insides of the classifying chutes 11i whether or not a jam takes place. In another implementation, the classifying chutes 11i may be formed of transparent substance.

The sorting apparatus 11 further comprises a drive shaft member 11k having a center axis aligned with the center axis CL of the drum member 11b and an electric motor unit 11m having an shaft functionally connected to the drive shaft member 11k. While driving current is being supplied to the electric motor unit 11m, the electric motor unit 11m rotates the drive shaft member 11k, and the drum member 11b is driven for rotation around the center axis CL.

The sorting apparatus 11 further comprises a controlling system 11n for controlling the angular position of the drum member 11b and the solenoid-operated actuator units 11g. The controlling system 11n is further operative to synchronize the testing system 12 with the sorting apparatus 11.

The controlling system 11n comprises an index unit 11o associated with the drive shaft 11k, a plurality of photo-interrupters 11p provided for the through-holes 111–118 and a controlling unit 11q electrically connected to the testing system 12, the solenoid-operated actuator units 11g, the electric motor unit 11m, the index unit 11o and the photo-interrupters 11p.

The index unit 11o is implemented by an index table using a Geneva mechanism. A combination of a stopper mechanism and micro-switching units is available for the index unit 11o, and is more economical than the Geneva mechanism. The index unit 11o measures an angular position of the through-hole 111 with respect to the funnel chute 11a, and reports the angular position to the controlling unit 11q. The index unit 11o is expected to accurately align the funnel chute 11a with one of the through-holes 111 to 118 and the through-holes 111 to 118 with the associated classifying chutes 11i, respectively. The alignment accuracy is equal to or less than 0.3 millimeter in this instance.

The photo-interrupters 11p radiate light beams BM across the through-holes 111 to 118, and the semiconductor device SD maintained on the blocking area 11f interrupts the light beam BM. However, while the semiconductor device SD is not being placed on the blocking area 11f of the shutter plate 11d, the light beam BM is not interrupted. The photo-interrupters 11p confirm the semiconductor device SD on the blocking area 11f, and are omissible.

The controlling unit 11q is implemented by a data processing unit such as, for example, a computer system, and controls the sorting operation as follows. The storage boxes 11j at the positions P7 and P8 are assumed to be assigned the first grade and the second grade, respectively, and the funnel chute 11a is initially aligned with the through-hole 111 as shown in FIG. 4. All of the solenoid-operated actuator units 11g retract the plungers, and the shutter plates 11d expose the respective blocking areas 11f to the associated through-holes 111 to 118, respectively.

The first semiconductor device SD is supplied to the testing system 12, and the examines device characteristics of the first semiconductor device SD. The testing system 12 decides the first semiconductor device SD to be the first grade, and informs the controlling unit 11q of the decided grade, i.e., the first grade. Then, the testing system 12 supplies the first semiconductor device SD through the funnel chute 11a to the through-hole 111. When the first semiconductor device SD arrived at the blocking area 11f of the shutter plate 11d, the photo-interrupter 11p reports the arrival to the controlling unit 11q. The controlling unit 11q does not supply the driving current to the solenoid-operated actuator unit 11g associated with the through-hole 111, because the index unit 11o informs the controlling unit that the through-hole 117 is presently aligned with the storage box 11j at the position P7.

Subsequently, the second semiconductor device SD is examined by the testing apparatus 12, and is decided to be the second grade. The testing system 12 informs the decided grade, i.e., the second grade to the controlling unit 11q, and the controlling unit 11q supplies the driving current to the electric motor unit 11m, and the electric motor unit 11m rotates the drum member 11b until the index unit 11o reports the alignment between the funnel chute 11a and the through-hole 112.

When the through-hole 112 is aligned with the funnel chute 11a, the testing system I 2 supplies the second semiconductor device SD through the funnel chute 11a to the through-hole 112, and the second semiconductor device SD is maintained on the blocking area 11f of the shutter plate 11d in the through-hole 112. As described hereinbefore, the drum member 11b is well unbalanced around the center axis CL, and stops at the target position without undeniable vibrations. Thus, the drum member 11b quickly changes the angular position, and the quick change is conducive to the decrease of the time period consumed by the sorting operation.

Even though the funnel chute 11a is aligned with the through-hole 112, the through-hole 111 is not aligned with the storage box 11j at the position P7, and the controlling unit 11q keeps the shutter plate 11d for the through-hole 111 closed.

In this manner, the testing system 12 sequentially decides the grades of the semiconductor devices SD, and the drum member 11b is rotated so as to sequentially store the semiconductor devices in the through-holes 111–118.

Upon completion of the examination on the third semiconductor device SD, the testing system 12 informs the controlling unit 11q of the decided grade of the third semiconductor device SD, and the controlling unit 11q supplies the driving current to the electric motor unit 11m so as to rotate the drum member 11b. When the index unit 11o informs the controlling unit 11q of the alignment between the through-hole 113 and the funnel chute 11a, the through-hole 111 is aligned with the classifying chute 11i for the storage box 11j at the position P7. Then, the testing system 12 delivers the third semiconductor device SD to the through-hole 113, and the controlling unit 11q supplies the driving current to the solenoid-operated actuator unit 11g associated with the through-hole 111. The plunger pushes the shutter plate 11d against the elastic force of the return spring 11h, and the aperture 11e of the shutter plate 11d connects the through-hole 111 to the classifying chute 11i connected to the storage box 11j at the position P7. The first semiconductor device SD slides along the classifying chute 11i, and is stored in the storage box 11j at the position P7.

While the first semiconductor device SD is traveling in the classifying chute 11i, the testing system 12 examines the device characteristics of the fourth semiconductor device SD, and the examination on the fourth semiconductor device SD is overlapped with the part of the sorting operation. For this reason, each of the semiconductor devices SD consumes the total time period of the time for the examination or the traveling in the classifying chute 11i and the time for the angular motion of the drum member 11b, and the total time period consumed by each semiconductor device SD is rather short than that of the prior art sorting apparatus.

The semiconductor device SD is conveyed from the through-holes 111 to 118 through the classifying chutes 11i to the storage boxes 11j, and the traveling path of each semiconductor device SD is shorter than that in the prior art sorting apparatus. For this reason, the possibility of the jam of the semiconductor device SD is rather small than that of the prior art sorting apparatus. Even if the semiconductor device SD is jammed in the classifying chute 11i, an operator easily finds the jam through the monitoring slot SLT.

As will be appreciated from the foregoing description, the sorting apparatus according to the present invention sorts the semiconductor devices at high speed, and decreases the manufacturing cost of the semiconductor device. Moreover, the traveling path of the semiconductor device is rather short, and the possibility of jam is decreased.

Second Embodiment

Figure 5:
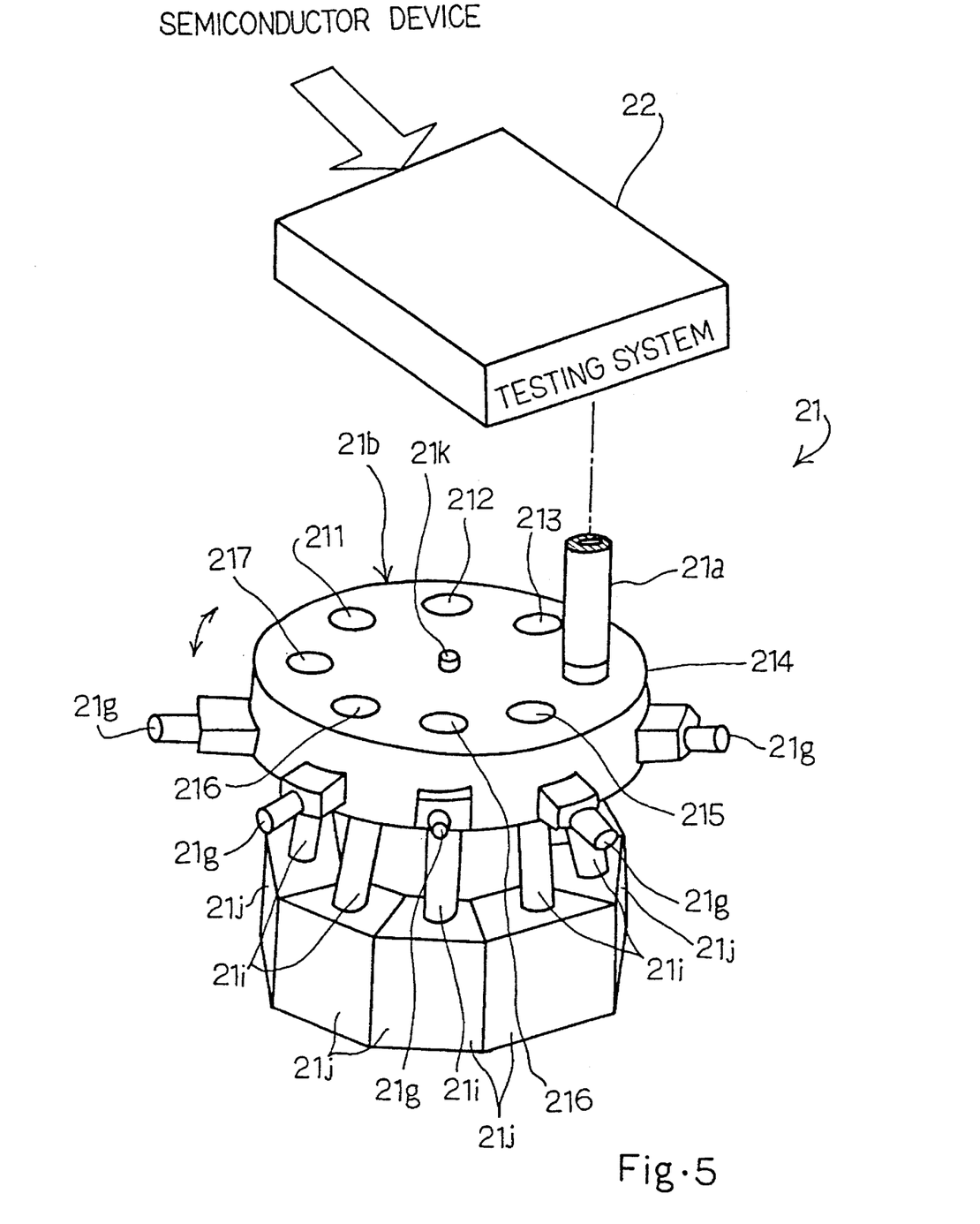
FIG. 5 is a perspective view showing the outer appearance of another sorting apparatus according to the present invention.
Figure 6:
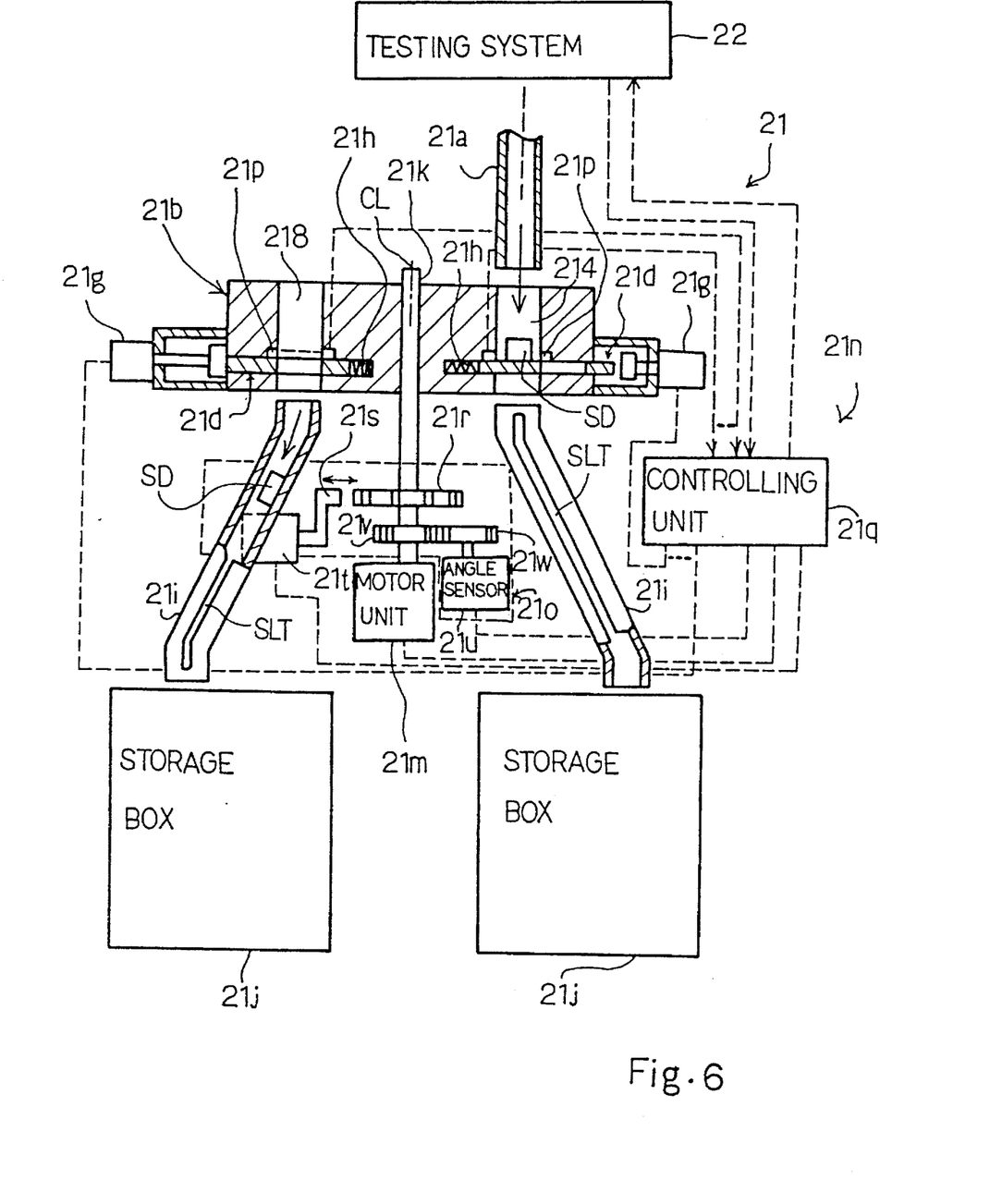
FIG. 6 is a partially cross sectional view showing the structure of the sorting apparatus shown in FIG. 5.

Turning to FIGS. 5 and 6 of the drawings, another sorting apparatus 21 embodying the present invention is associated with a testing system 22. The testing system 22 is similar to the testing system 12, and decides the grade of a semiconductor device SD through a testing operation.

The sorting apparatus 21 comprises a funnel chute 21a, a rotatable drum member 21b with through-holes 211 to 218, a plurality of shutter plates 21d, a plurality of solenoid-operated actuator units 21g, a plurality of return springs 21h, a plurality of classifying chutes 21i, a plurality of storage boxes 21j, a drive shaft 21k, an electric motor unit 21m and a controlling system 21n. The funnel chute 21a, the rotatable drum member 21b, the plurality of shutter plates 21d, the plurality of solenoid-operated actuator units 21g, the plurality of return springs 21h, the plurality of classifying chutes 21i, the plurality of storage boxes 21j, the drive shaft 21k and the electric motor unit 21m are similar to the funnel chute 11a, the rotatable drum member 11b, the plurality of shutter plates 11d, the plurality of solenoid-operated actuator units 11g, the plurality of return springs 11h, the plurality of classifying chutes 11i, the plurality of storage boxes 11j, the drive shaft 11k and the electric motor unit 11m, respectively, and are not described in detail hereinbefore for avoiding repetition.

The controlling system 21n comprises an index unit 21o, a plurality of photo-interrupters 21p respectively associated with the through-holes 2111 to 218 and a controlling unit 21q. The photo-interrupters 21p detect the semiconductor devices SD maintained on the blocking areas of the shutter plates 21d, and reports the detection to the controlling unit 21q as similar to the photo-interrupters 11p of the first embodiment.

The electric motor unit 21m bi-directionally rotates the drum member 21b around the center axis CL, and the index unit 21o decides the angular position of the drum member 21o. In detail, the index unit 21o comprises an index plate 21r fixed to the drive shaft 21k and having a plurality of notches, a stopper 21s engageable with one of the notches of the index plate 21r, a solenoid-operated actuator unit 21t having a plunger fixed to the stopper 21s, an angle sensor 21u and gear members 21v and 21w meshed with each other and fixed to the drive shaft 21k and the angle sensor 21u, respectively.

In this instance, the through-holes 211 to 218 are assigned to grades, and the semiconductor device SD is thrown into one of the through-hole depending upon the decided grade.

Figure 7:
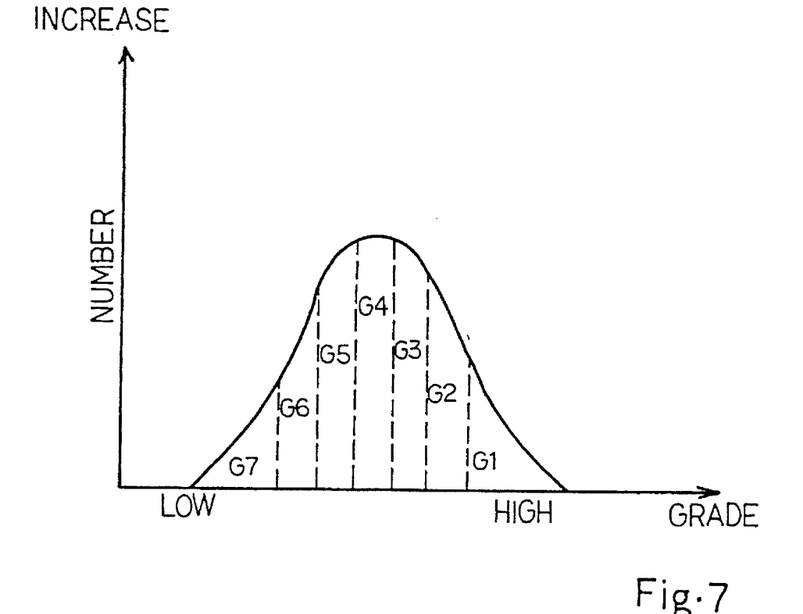
FIG. 7 is a graph showing a dispersion of examined semiconductor device.

In detail, semiconductor devices in the same lot are distributed as shown in FIG. 7, and G1, G2, G3, G4, G5, G6 and G7 are indicative of the grades. G1 is the highest grade, and G7 is the lowest grade. Grades G1 to G7 form a normal distribution, and grade G4 is the largest in number. Although the distribution curve is slightly different from that shown in FIG. 7, the tendency is common among different lots.

Figure 8:
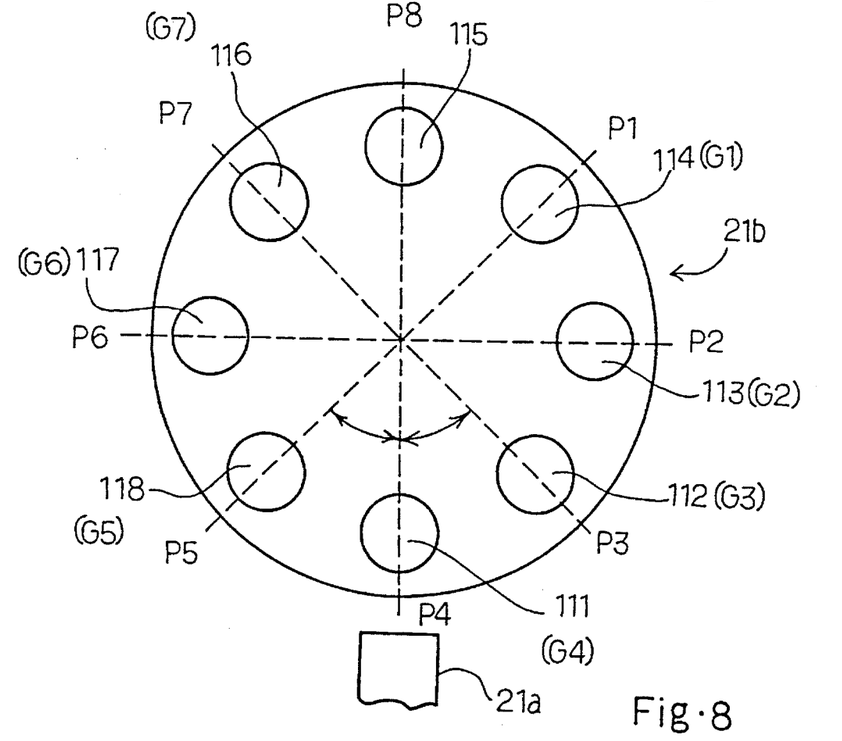
FIG. 8 is a plan view showing the arrangement of through-holes formed in a rotatable drum member incorporated in the sorting apparatus shown in FIGS. 5 and 6.

As shown in FIG. 8, the through-hole 211 is assigned to the grade G4, and the through-holes 218 and 212 on both sides of the through-hole 211 are respectively assigned to the grade G3 and G5 large in number next to the highest grade G4. The through-holes 213 and 217 are respectively assigned to the grades G2 and the grade G6), and the highest grade G1 and the lowest grade G7 are respectively assigned the through-hole 214 and the through-hole 216. The drum member 21b has a home position where the funnel chute 21a is aligned with the through-hole 211, and is maintained at the home position in the examination on the semiconductor device SD. P1 to P8 are representative of the positions of the storage boxes 21j for the grades G1 to G8. While the drum member 21b is being maintained at the home position, the through-holes 114, 113, 112, 111, 118, 117, 116 assigned to the grades G1 to G7 are respectively aligned to the classifying chutes 21i connected to the storage boxes 21j at the positions P1 to P8, respectively.

Description is hereinbelow made on a sorting operation of the sorting apparatus 21. The controlling unit 21q causes the stopper 21s to be held in meshing engagement with one of the notches of the index table 21r, and the drum member 21b is initially maintained at the home position. The angle sensor 21u informs the controlling unit 21q of zero degrees with respect to the home position, and all of the solenoid-operated actuator units 21q retract the plungers so as to expose the blocking areas of the shutter plates 21d l *to the associated through-holes 111 to 118.*

The first semiconductor device SD is supplied to the testing system 22, and decides the grade of the first semiconductor device SD to be the grade G4. The testing system 22 informs the controlling unit 21q of the grade G4, and the controlling unit 21q keeps the drum member 21b at the home position. The first semiconductor device SD is supplied from the testing system 22 through the funnel chute 21a to the through-hole 111 , and the first semiconductor device SD is maintained on the blocking area in the through-hole 111.

Subsequently, the second semiconductor device SD is supplied to the testing system 22, and the controlling unit 21q momentarily energizes the solenoid-operated actuator unit 21g for the through-hole 111. While the testing system 22 is examining the second semiconductor device SD, the first semiconductor device SD slides along the classifying chute 21i, and is stored in the storage box 21j for the grade G4.

The testing system 22 decides the second semiconductor device SD to be the grade G5, and informs the controlling unit 21q of the grade G5. The controlling unit 21q causes the solenoid-operated actuator unit 21t to retract the stopper 21s, and instructs the electric motor unit 21m to rotate the drum member 21b in the counter clockwise direction over 45 degrees. When the through-hole 118 is aligned with the funnel chute 21a, the angle sensor 21u informs the controlling unit 21q of the completion of the angular motion over 45 degrees, and the controlling unit 21q stops the driving current to the electric motor unit 21m. The controlling unit 21q causes the solenoid-operated actuator unit 21t to project the stopper 21s, and the stopper 21s is brought into meshing engagement with the notch of the index table 21r. The testing system 22 supplies the second semiconductor device SD through the funnel chute 21a to the through-hole 118, and the second semiconductor device SD is maintained on the blocking area of the shutter plate 21d.

When the photo-interrupter 21p detects the second semiconductor device SD on the blocking area, the controlling unit 21q causes the solenoid-operated actuator unit 21t to retract the stopper 21s, and the stopper 21s is released from the index table 21r. Upon release from the index table 21r, the controlling unit 21q supplies the driving current to the electric motor unit 21m, and the electric motor unit 21m rotates the drum member 21b in the clockwise direction over 45 degrees. When the drum member 21b arrives at the home position, the angle sensor 21u reports the arrival to the controlling unit 21q, and the through-hole 118 is aligned with the classifying chute 21i connected to the storage box 21j for the grade G5. The controlling unit 21q supplies driving currents to the solenoid-operated actuator unit 21t so as to bring the stopper 21s into meshing engagement with the index table 21r.

The controlling unit 21q momentarily supplies the driving current to the solenoid-operated actuator unit 21q for the through-hole 118, and the second semiconductor device SD slides along the classifying chute 21i. Thus, the second semiconductor device SD is stored in the storage box 21j for the grade G5.

The third semiconductor device SD is supplied to the testing system 22 in synchronism with the supply of the driving current to the solenoid-operated actuator unit 21g, and the testing system 22 examines the third semiconductor device SD while the second semiconductor device SD is sliding along the classifying chute 21i.

The testing system 22 decides the third semiconductor device SD to be the grade G3, and informs the controlling unit 21q of the grade G3. The controlling unit 21q causes the solenoid-operated actuator unit 21t to retract the stopper 21s, and instructs the electric motor unit 21m to rotate the drum member 21b in the clockwise direction over 45 degrees. When the through-hole 112 is aligned with the funnel chute 21a, the angle sensor 21u informs the controlling unit 21q of the completion of the angular motion over 45 degrees, and the controlling unit 21q stops the driving current to the electric motor unit 21m. The controlling unit 21q causes the solenoid-operated actuator unit 21t to project the stopper 21s, and the stopper 21s is brought into meshing engagement with the notch of the index table 21r. The testing system 22 supplies the third semiconductor device SD through the funnel chute 21a to the through-hole 112, and the third semiconductor device SD is maintained on the blocking area of the shutter plate 21d.

When the photo-interrupter 21p detects the third semiconductor device SD on the blocking area, the controlling unit 21q causes the solenoid-operated actuator unit 21t to retract the stopper 21s, and the stopper 21s is released from the index table 21r. Upon release from the index table 21r, the controlling unit 21q supplies the driving current to the electric motor unit 21m, and the electric motor unit 21m rotates the drum member 21b in the counter clockwise direction over 45 degrees. When the drum member 21b arrives at the home position, the angle sensor 21u reports the arrival to the controlling unit 21q, and the through-hole 112 is aligned with the classifying chute 21i connected to the storage box 21j for the grade G3. The controlling unit 21q supplies driving currents to the solenoid-operated actuator unit 21t so as to bring the stopper 21s into meshing engagement with the index table 21r.

The controlling unit 21q momentarily supplies the driving current to the solenoid-operated actuator unit 21g for the through-hole 112, and the third semiconductor device SD slides along the classifying chute 21i. Thus, the third semiconductor device SD is stored in the storage box 21j for the grade G3.

The fourth semiconductor device SD is supplied to the testing system 22 in synchronism with the supply of the driving current to the solenoid-operated actuator unit 21g, and the testing system 22 examines the fourth semiconductor device SD while the fourth semiconductor device SD is sliding along the classifying chute 21i.

Thus, the drum member 21b transfers the semiconductor devices of the grade G4 without a rotation, and is rotated around the center axis so as to receive the semiconductor devices except for the grade 4. However, the semiconductor devices of the grade 4 are the largest in number, and are transferred to the storage box 21j for the grade G4 without the rotation. This results in speed-up in the sorting operation.

The sorting apparatus implementing the second embodiment achieves all the advantages of the first embodiment, and is rather suitable than the first embodiment when the number of grades is relatively small.

Although particular embodiments of the present invention have been shown and described, it will be obvious to those skilled in the art that various changes and modifications may be made without departing from the spirit and scope of the present invention. For example, a plurality of semiconductor devices of a certain grade may be stored in a through-hole until the through-hole is aligned with a storage box assigned the certain grade. The sorting apparatus according to the present invention is not limited to the sorting operation on the grades, and is, by way of example, available for a sorting operation for different models of a semiconductor device. Moreover, the number of through-holes is not limited to eight, and the solenoid-operated actuator units are replaceable with any kind of actuator.

What is claimed is:

1. A sorting apparatus for semiconductor devices, comprising:

a rotatable drum member having a plurality of through-holes allowing said semiconductor devices to selectively pass therethrough;

a driving means provided for said rotatable drum member, and rotating said rotatable drum member so as to selectively align said through-holes with an outlet port for said semiconductor devices;

a plurality of shutter plates respectively associated with said plurality of through-holes, each shutter plate being changeable between a first position and a second position, each shutter plate in said first position allowing one of said semiconductor devices to pass through the associated through-hole, each shutter plate in said second position causing said one of said semiconductor devices to remain in said associated through-hole;

an actuating means associated with said plurality of shutter plates, said actuating means being operative to change each one of said plurality of shutter plates between said first position and said second position;

a plurality of storage boxes associated with said through-holes for storing said semiconductor devices passing through the associated through-holes; and a controlling means provided for said driving means and said actuating means, said controlling means being operative to select one of said through-holes to be aligned with said outlet port and to instruct said actuating mean to cause each of said plurality of shutter plates to take said first position or said second position.

2. The sorting apparatus as set forth in claim 1, further comprising classifying chutes obliquely connected between said through-holes and said storage boxes so as to cause said semiconductor devices to selectively slide along said classifying chutes at low speed.

3. The sorting apparatus as set forth in claim 2, in which said classifying chutes are formed of non-transparent material, and monitoring slots are formed in the classifying chutes so as to check whether or not one of said semiconductor devices is jammed in one of said classifying chutes.

4. The sorting apparatus as set forth in claim 2, in which said classifying chutes are formed of a transparent material.

5. The sorting apparatus as set forth in claim 1, in which said controlling means instructs said driving means to intermittently rotate said drum member in one direction, and said semiconductor devices are sequentially supplied onto said shutter plates in said second positions while said drum member is stopping, said controlling means instructing said actuating means to change each of said shutter plates mounting the semiconductor device to said first position when the through-hole accommodating said semiconductor device is aligned with one of said storage boxes into which said semiconductor device is to be stored.

6. The sorting apparatus as set forth in claim 1, in which said drum member has a home position where one of said through-holes is aligned with said outlet port, and semiconductor devices classified in a highest frequency grade group are stored in said one of said through-holes, said semiconductor devices of said highest frequency grade group being supplied onto said shutter plate in said second position without rotation of said drum member, said controlling means instructing said actuating means to change said shutter plate associated with said one of said through-holes to said first position for storing said semiconductor devices of said highest frequency grade group into one of said storage boxes.

7. The sorting apparatus as set forth in claim 6, in which groups of higher frequencies are assigned to the adjacent through-holes on both sides of said one of said through-holes, said controlling means instructing said driving means to rotate said drum member in one direction so as to align said outlet port with one of said adjacent through-holes, the semiconductor devices of one of the groups of higher frequencies being supplied onto the shutter plate in said second position, said controlling means instructing said driving means to rotate said drum member in the opposite direction so as to align said one of said adjacent through-holes with another of said storage boxes, said controlling means instructing said actuating means to change said shutter plate associated with said one of said adjacent through-holes to said first position for storing said semiconductor devices of said one of said groups of higher frequencies into said another of said storage boxes.

8. The sorting apparatus as set forth in claim 1, in which said semiconductor devices are supplied from a judging means for categorizing said semiconductor devices into a plurality of groups through said outlet port to said sorting apparatus, said judging means starting the categorizing operation when said controlling means instructs said actuating means to change one of said shutter plates to said first position.

* * * * *